United States Patent [19]

Mouri et al.

[11] Patent Number: 5,364,732
[45] Date of Patent: Nov. 15, 1994

[54] IMAGE FORMING METHOD AND IMAGE FORMING MEDIUM

[75] Inventors: Akihiro Mouri, Kokubunji; Tetsuro Fukui, Kawasaki; Masato Katayama, Yokohama; Kazuo Isaka, Tokyo; Susumu Nakamura, Kawasaki, all of Japan

[73] Assignee: Canon Kabushiki Kaisha, Tokyo, Japan

[21] Appl. No.: 863,142

[22] Filed: Apr. 2, 1992

Related U.S. Application Data

[63] Continuation of Ser. No. 416,489, Oct. 3, 1989, abandoned.

[30] Foreign Application Priority Data

Oct. 4, 1988 [JP] Japan ................ 63-250163
Jul. 28, 1989 [JP] Japan ................ 1-194266

[51] Int. Cl.⁵ .............. G03C 5/54; G03C 1/68; G03F 7/26
[52] U.S. Cl. ............... 430/201; 430/200; 430/203; 430/292; 430/330; 503/208; 503/227; 346/76 PH
[58] Field of Search .......... 430/200, 201, 203, 330, 430/292; 503/201, 208, 227; 346/76 R, 76 PH

[56] References Cited

U.S. PATENT DOCUMENTS

| 3,245,796 | 4/1966 | Burg ................ 430/201 |
| 4,006,018 | 2/1977 | Wiese ............... 430/201 |
| 4,587,198 | 5/1986 | Fisch ............... 430/201 |
| 4,624,910 | 11/1986 | Takeda ............. 430/264 |
| 4,649,098 | 3/1987 | Takeda ............. 430/203 |
| 5,001,032 | 3/1991 | Katayama et al. ... 430/254 |

FOREIGN PATENT DOCUMENTS

1547794 12/1970 Germany .
0197806 6/1978 Germany ............. 430/201

Primary Examiner—Richard L. Schilling
Attorney, Agent, or Firm—Fitzpatrick, Cella, Harper & Scinto

[57] ABSTRACT

An image forming method, comprises the steps of, using an image forming medium containing a heat-diffusible coloring matter, a polymerizable polymer precursor and a polymerization initiator; causing said polymerizable polymer precursor of said image forming medium to selectively polymerize to form a latent image comprised of a polymerized area and an unpolymerized area; and heating said image forming medium on which said latent image has been formed and which is laid overlapping on an image receiving medium, so as to satisfy the following formula (A):

$$Tg_1 \leq Ttrans \leq Tg_2 \qquad (A)$$

wherein Ttrans represents a temperature of said image forming medium, $Tg_1$ represents a glass transition point of said unpolymerized area, and $Tg_2$ represents a Glass transition point of said polymerized area, to diffusion-transfer said heat-diffusible coloring matter contained in said image forming medium to said image receiving medium, thereby forming an image comprised of said heat-diffusible coloring matter on said image receiving medium.

6 Claims, 2 Drawing Sheets

IMAGE FORMING METHOD AND IMAGE FORMING MEDIUM

This application is a continuation of application Ser. No. 07/416,489 filed Oct. 3, 1989, now abandoned.

BACKGROUND OF THE INVENTION

1. Field of the Invention

The present invention relates to a method of forming an image comprised of a heat-diffusible coloring matter, and also to an image forming medium used in the method.

2. Related Background Art

Hitherto prevailingly employed as methods of making a record by heating are a direct thermal method, a thermal transfer recording method, a sublimation transfer method, and so forth.

The direct thermal method is a method in which a color-forming material having the property of forming a color by heat is heated in the desired pattern form with a thermal head or the like to form a character or image. In this method, the resulting image tends to cause color formation at the area in which no color has been formed, under the influence of heat or chemicals. This may disadvantageously result in a poorness in the stability or storage stability of images. It is difficult to produce a color image with this method.

On the other hand, the thermal transfer method is a method which employs an ink doner sheet formed of a plastic film made of polyester or the like coated with a heat-fusible ink containing a coloring material, and in which the doner sheet is heated in the desired pattern form with a thermal head or the like to bring the ink of the doner sheet into heat fusion and then the ink is transferred to an image receiving paper contiguously provided. An image is thus formed. In this method, plural colors can be overlapped to form a color image. A special unit or special doner sheet, however, is required for obtaining an image with density gradation.

The sublimation transfer method is a method which employs an ink doner sheet formed of a resin film coated with a heat-fusible ink containing a sublimating dye, and in which the doner sheet is heated in the desired pattern form with a thermal head or the like to bring only the dye at the heated area into sublimation, which is then transferred to an image receiving paper. An image is thus formed. Different from the above thermal transfer recording method, this sublimation transfer method enables control of the thermal head, control of heat-applying energy, control of heat-application time, thereby obtaining an image with density gradation.

FIG. 5 is a graph to exemplify the relationship between the temperature (Ttrans) of a heated ink doner sheet and the optical density (O.D.) of the coloring matter diffusion-transferred onto an image-receiving paper from the inside of the doner sheet, in a conventional sublimation transfer method. The coloring matter has a specific diffusion temperature (Tdiffuse) depending on the type of the coloring matter. In general, the smaller the molecular weight of the coloring matter is, the lower this Tdiffuse is; and the more polar groups the coloring matter has, the higher it is. Heating this coloring matter to a temperature not lower than the Tdiffuse (i.e. making the relationship of $T_{trans} \geq T_{diffuse}$) brings about diffusion of the coloring matter at the heated area and transfer thereof to an image receiving medium, and thus a image of coloring matter can be obtained on the image-receiving medium. In such a conventional sublimation transfer method, however, binders in the ink doner sheet have uniform physical properties and are by no means capable of suppressing the diffusibility of the coloring matter. For this reason, it has been not easy to control the sublimation of the coloring matter with good precision.

In addition, in the conventional sublimation transfer method, the thermal head repeats the on-off for heat generation at intervals of 1 msec and hence must be heated to a considerably high temperature before the desired sublimation and density can be achieved. Under heating at such a high temperature, however, it has sometimes occurred that not only the sublimating dye but also the binder component in the sheet are transferred to the image receiving medium to lower the image quality of the resulting image.

SUMMARY OF THE INVENTION

An object of the present invention is to provide a method that can readily form an image with a good contrast and a high image quality, and an image forming medium used in the method.

Another object of the present invention is to provide an image forming method that can obtain an image with a high gradation and also can readily control the gradation or carry out an image formation process, and also an image forming medium used in the method.

The image forming method of the present invention comprises the steps of, using an image forming medium containing a heat-diffusible coloring matter, a polymerizable polymer precursor and a polymerization initiator;

causing said polymerizable polymer precursor of said image forming medium to selectively polymerize to form a latent image comprised of a polymerized area and an unpolymerized area; and heating said image forming medium on which said latent image has been formed and which is laid overlapping on an image receiving medium, so as to satisfy the following formula (A):

$$T_{g1} \leq T_{trans} \leq T_{g2} \tag{A}$$

wherein Ttrans represents a temperature of said image forming medium, $T_{g1}$ represents a glass transition point of said unpolymerized area, and $T_{g2}$ represents a glass transition point of said polymerized area, to diffusion-transfer said heat-diffusible coloring matter contained in said image forming medium to said image receiving medium, thereby forming an image comprised of said heat-diffusible coloring matter on said image receiving medium.

In another embodiment, the image forming method of the present invention comprises the steps of, using an image forming medium containing a heat-diffusible coloring matter, a polymerizable polymer precursor and a polymerization initiator;

causing said polymerizable polymer precursor of said image forming medium to selectively polymerize to form a latent image comprised of a polymerized area and an unpolymerized area; and heating said image forming medium on which said latent image has been formed and which is laid overlapping on an image receiving medium, so as to satisfy the following formula (A):

$$Tg_1 \leq T_{trans} \leq Tg_2 \quad (A)$$

wherein $T_{trans}$ represents a temperature of said image forming medium, $Tg_1$ represents a glass transition point of said unpolymerized area, and $Tg_2$ represents a glass transition point of said polymerized area,
to diffusion-remove said heat-diffusible coloring matter contained in said image forming medium, thereby forming an image comprised of said heat-diffusible coloring matter having remained on said image forming medium.

The image forming medium of the present invention comprises a heat-diffusible coloring matter, a polymerizable polymer precursor and a polymerization initiator, and has a latent image comprised of a polymerized area and an unpolymerized area that satisfy the following formula (B).

$$Tg_2 - Tg_1 \geq 30° \text{ C.} \quad (B)$$

wherein $Tg_1$ represents a glass transition point of said unpolymerized area, and $Tg_2$ represents a glass transition point of said polymerized area.

DETAILED DESCRIPTION OF THE PREFERRED EMBODIMENTS

Figure 1:
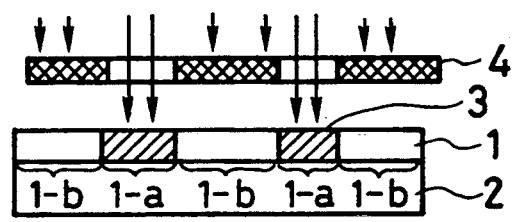
FIGS. 1 to 3 diagramatically illustrate an embodiment of a series of steps in the method of the present invention.

The method of the present invention is an image forming method that forms a latent image comprised of the polymerized area and unpolymerized area on an image forming medium containing a heat-diffusible coloring matter, and utilizes the difference in diffusibility of the heat-diffusible coloring matter in the latent image.

In the present invention, the diffusibility of the heat-diffusible coloring matter is suppressed to a certain extent by the molecular chain of the polymer at the polymerized area in the latent image. Hence, the coloring matter in the polymerized area can not be diffused much unless the polymerized area is heated to a temperature higher than its glass transition point so that the molecular chain is loosened (i.e., the molecular chain is made less tense as a result of molecular vibration by heat).

In the method of the present invention, the "polymerized area" mentioned in the present invention refers to the area that has been polymerized in the step of applying energy selectively (i.e., in the desired pattern form) to the polymerizable polymer precursor contained in the image forming medium, and the "unpolymerized area" mentioned in the present invention refers to the area that has not been polymerized in the above step. Thus, the "latent image" mentioned in the present invention refers to the desired pattern comprised of the "polymerized area" and "unpolymerized area". The polymerization herein mentioned also includes an instance of crosslinking. The "unpolymerized area" also includes not only an instance in which no polymerization took place at all, but also an instance in which the area is substantially unpolymerized, in other words, an instance in which the area has been polymerized only to the extent that may not hinder a good diffusibility of the heat-diffusible coloring matter (or the extent that may not affect image formation). The "heat-diffusible coloring matter" mentioned in the present invention means, for example, a heat-diffusible dye, or a diffusible substance capable of forming a color as a result of reaction with a developer after the heat-diffusion.

In the present invention, the glass transition point Tg is obtained by measuring the temperature characteristics of a recording layer at a frequency of 1 to 10 Hz using a compulsory vibration viscoelastometer, and the temperature at which tan δ shows a peak as a result of the measurement is regarded as Tg. In the case when a support of the image forming medium has no heat-resistance to cause a difficulty in the measurement of the glass transition point, a sample is prepared which comprises a 7.5 μm thick polyimide film provided thereon with a recording layer having the same composition as the recording layer to be measured, or a sample is prepared which comprises a glass fiber impregnated with a composition having the same composition as the recording layer to be measured, and the glass transition point is measured according to the above measuring method (In this instance, the glass transition point at the polymerized area is measured by causing the sample to polymerize under the same conditions as the instance where an image is actually formed.

An embodiment of the image forming method of the present invention will be described below with reference to the accompanying drawings.

First, as exemplified in FIG. 1, an image forming medium is prepared, comprising a recording layer 1 containing a heat-diffusible coloring matter, a polymerizable polymer precursor and a polymerization initiator, which is formed on a support 2. These components and so forth will be detailed later.

Next, the recording layer 1 is exposed to light through a mask 4, using light having an absorption wavelength of the polymerization initiator contained in the recording layer 1, to cause the polymerizable polymer precursor in the recording layer 1 to polymerize, thereby forming a latent image comprised of a polymerized area 1-a and an unpolymerized area 1-b corresponding with the pattern of the mask 4.

The step shown in FIG. 1 illustrates an example, and the present invention is by no means limited to this. Namely, any polymerization methods may be employed so long as they can obtain the latent image comprised of areas having different glass transition points Tg. For example, in addition to the mask exposure as exemplified in the above, analog exposure or digital exposure may be employed. In place of the photopolymerization, thermopolymerization using a thermal head or the like may also be carried out. The exposure and heating may also be simultaneously carried out so that the rate of polymerization layer can be accelerated. When the polymerization is carried out by heating, however, the heating may preferably be carried out at temperatures lower than the diffusion temperature of the heat-diffusible coloring matter contained in the image forming medium. Also in obtaining the image with a high gradation, the present invention requires no limitations on the method of polymerization so long as it is a polymerization method that can obtain a gradational Tg.

In this step, taking account of obtaining an image with a good contrast, it is preferred to form a latent image that may give a difference of not less than 30° C.

between the glass transition point $Tg_2$ of the polymerized area 1-a and the glass transition point $Tg_1$ of the unpolymerized area 1-b. The image forming medium of the present invention comprises a medium having such a latent image. The image forming method of the present invention, however, may not be limited to the formation of the image forming medium of the present invention, and may be a method in which a latent image having a difference of less than 30° C. between $Tg_1$ and $Tg_2$ is formed. The value of $Tg_1$ is also preferred to be smaller, because the heat-diffusible coloring matter can be better diffused, the optical density on the image-receiving medium becomes higher, and the sublimation and removal of the coloring matter take place in a better state. An excessively lower value of $Tg_1$, however, is not desirable since the corresponding area may turn liquid, resulting in difficulty in handling. Hence, the value of $Tg_1$ should preferably range from −10° to 80° C. in approximation. On the other hand, the value of $Tg_2$ should preferably range from 80° to 220° C. in approximation.

In this step, the light source used in carrying out the exposure, includes, for example, sunlight, tungsten lamps, mercury lamps, halogen lamps, xenon lamps, fluorescent lamps, LED, lasers, electron rays, and X-rays. The exposure means that uses no mask includes, for example, liquid crystal shutter arrays, CRT, and optical fiber tubes.

Figure 2:
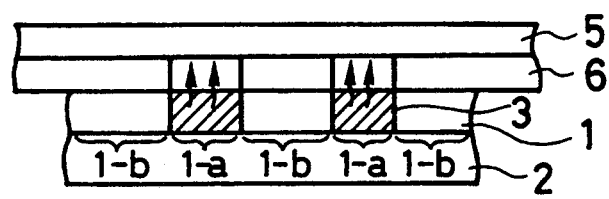

Subsequently, in the method of the present invention, as shown in FIG. 2, the recording layer 1 on which the latent image has been formed and an image receiving layer 6 of the image receiving medium provided on a support 5 are laid overlapping each other and heated, so that the heat-diffusible coloring matter contained in the image forming medium is diffusion-transferred to the image receiving layer 6. In this transfer, the heating of the image forming medium is carried out so that the temperature (Ttrans) of the image forming medium at the time of the transfer may be $Tg_1 \leq Ttrans \leq T_2$. As a result, the heat-diffusible coloring matter inside the unpolymerized area is diffused in a good state to form on the image receiving medium a transferred image with a high density. On the other hand, since the polymer molecular chain inside the polymerized area is not loosened that much so the heat-diffusible coloring matter is transferred only a little to the image receiving medium side. It is therefore possible to obtain on the image receiving medium a fog-free, good image having a high contrast.

Figure 4:
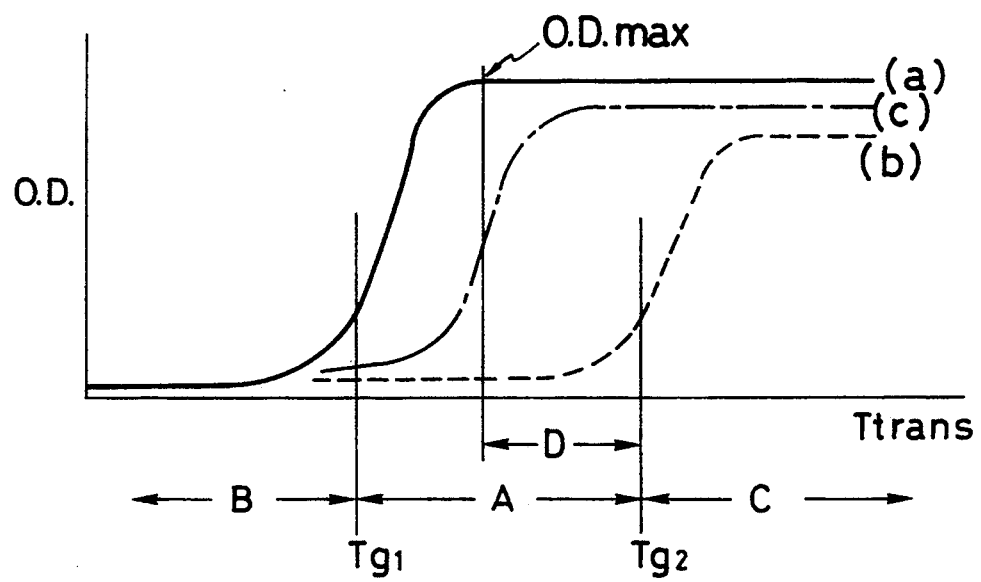
FIGS. 4 and 5 are graphs to exemplify the relationship between the transfer temperature of a heat-diffusible coloring matter and the optical density (O.D.) of the transferred image.
Figure 5:
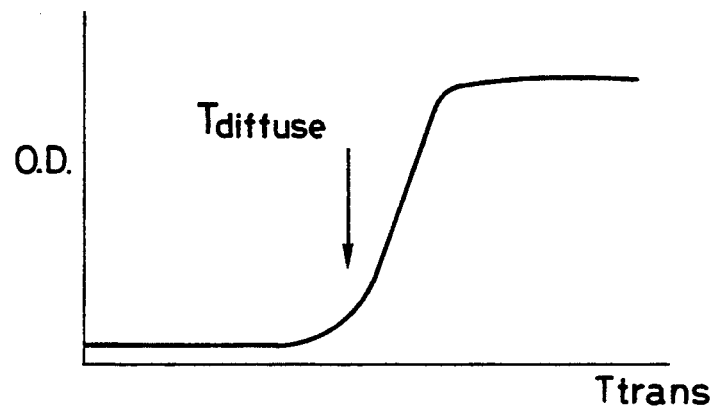

FIG. 4 is a graph to show the relationship between the temperature (Ttrans) of the heated image forming medium and the optical density (O.D.) of the coloring matter diffusion-transferred onto an image-receiving paper from the inside of the image forming medium. In this graph, the curve (a) shows the above relationship in respect of the unpolymerized area and the curve (b) shows the above relationship in respect of the polymerized area. The temperature of the image forming medium is a value obtained by measurement on a heater or the surface of a heat roller used when the transfer is carried out.

As shown by the curve (a) in FIG. 4, the heat-diffusible coloring matter in the unpolymerized area of the image forming medium begins to be transferred onto the image-receiving medium, from the temperature corresponding to the glass transition point ($Tg_1$) of the unpolymerized area thereof, and the binder and the molecules of the polymerizable polymer precursor, constituting the above unpolymerized area, are loosened with a rise of Ttrans, so that the diffusion transfer performance of the heat-diffusible coloring matter can be improved and the optical density (O.D.) can be increased.

On the other hand, as shown by the curve (b) in the same FIG. 4, the heat-diffusible coloring matter in the polymerized area of the image forming medium begins to be transferred onto the image-receiving medium, from the temperature corresponding to the glass transition point ($Tg_2$) of the polymerized area thereof, and the binder and polymer molecules constituting the above polymerized area are loosened with a rise of Ttrans, so that the diffusion transfer performance of the heat-diffusible coloring matter can be improved and the optical density (O.D.) can be increased.

Because of the relationship between the curves (a) and (b) as in the above, when Ttrans is lower than $Tg_1$ (the region B in FIG. 4), the heat-diffusible coloring matter is transferred onto the image-receiving medium with difficulty from both the polymerized area and unpolymerized area of the image forming medium, resulting in formation of no sharp image.

On the other hand, when Ttrans is higher than $Tg_2$ (the region C in FIG. 4), the optical density (O.D.) of the heat-diffusible coloring matter transferred onto the image-receiving medium from the unpolymerized area of the image forming medium can be sufficiently high, but the heat-diffusible coloring matter is transferred also from the polymerized area, resulting in generation of fog, undesirably. Hence, in the image forming method of the present invention, the Ttrans is preferably within the region A in FIG. 4, i.e., $Tg_1 \leq Ttrans \leq Tg_2$. A good image with a high contrast and free of fog can thereby be obtained.

In the method of the present invention, which requires no heating at a high temperature, components other than the heat-diffusible coloring matter (the binder, polymerizable polymer precursor, etc.) contained in the image forming medium can be suppressed from being melted or sublimated and then transferred to the image-receiving medium, so that an image with a better image quality can be obtained.

It is further particularly preferred to control the Ttrans to be within the region D in FIG. 4, since the O.D. value of the image obtained on the image-receiving medium can be made sufficiently high. The region D is within the range between $Tg_1$ and $Tg_2$, and is a region in which the O.D. value is substantially flat.

In the case when the gradation is obtained using the image forming method of the present invention, the amount of transfer of the heat-diffusible coloring matter may be changed by changing the degree of polymerization in the layer containing the heat-diffusible coloring matter as shown by the curve (c) in FIG. 4.

More specifically, in this method, an image with a high gradation can be obtained by controlling the Tg of the latent image not to comprise only the two $Tg_1$ and $Tg_2$, but to comprise a gradational Tg within the range of from $Tg_1$ to $Tg_2$. In other words, when, for example, the step of forming the latent image in the method of the present invention is carried out by the photopolymerization according to pattern-like exposure through a mask, the mask that may be used is not a mask comprised only of a transmissive area and an untransmissive area, but a gradation mask also having a semi-transmissive area as in photographic negative films. Analog exposure carried out using such a mask results in gradational polymerization corresponding with the mask pattern, so that a latent image having three or more gradational Tg's corresponding with it can be formed. The image forming medium having such a latent image may be heated, so that an image with a high gradation corresponding with the gradertonal Tg's can be obtained with ease. Herein, the $Tg_2$ in the above formula $Tg_1 \leq Ttrans \leq Tg_2$ in the case when the image with such a gradation is obtained refers to the highest glass transition point in the polymerized area.

As described above, compared with the conventional sublimation transfer method previously discussed, the image forming method of the present invention is a very simple method that can obtain an image with a high gradation according to the operation of controlling the degree of polymerization (and degree of cross-linking) of the polymerizable polymer precursor contained in the image forming medium.

In the method of the present invention, which also requires no heating at a high temperature as in the conventional sublimation transfer method (using a thermal head), other components (the binder, polymerizable polymer precursor, etc.) contained in the image forming medium can be suppressed from being melted or sublimated and then transferred to the image-receiving medium, so that an image with a better image quality can be obtained.

As the image receiving layer 6, there are no particular limitations so long as the heat-diffusible coloring matter can be diffusion-transferred in a good state and a good image can be formed. For example, there can be used various types of materials such as polyester resins, polycarbonate resins, polyvinyl acetate resins, polyurethane resins, polyamide resins, polycaprolactone resins, and polyvinyl chloride resins.

Figure 3:
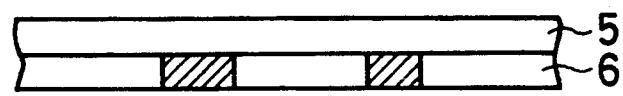

After the diffusion transfer has been carried out in the above way, the image forming medium may be peeled, so that an image as shown in FIG. 3, comprised of the heat-diffusible coloring matter, can be obtained in the image receiving layer 6.

In carrying out the heat-diffusion of the heat-diffusible coloring matter, the above image receiving medium may not be used, and instead the image forming medium may be heated to diffusion-remove the heat-diffusible coloring matter, thereby forming an image comprised of the heat-diffusible coloring matter having remained on the image forming medium.

In the step of heat-diffusion in the method of the present invention, there are no particular limitations on the heating temperature so long as it is the temperature that satisfies the relationship of the above formula (A). An optimal heating temperature, though variable depending on various conditions, should range from 70° C. to 250° C., and preferably from 80° C. to 160° C. As heating means therefor, a hot plate, a heat roll, a thermal head or the like can be used, as well as a method in which the heating is carried out by electrification on a heating element for the support, or a method in which the heating is carried out by using a light source of infrared rays or irradiation of laser beams.

The image forming medium (the one in which the latent image has not been formed) used in the method of the present invention will be described below in detail.

The image forming medium used in the present invention contains a heat-diffusible coloring matter, a polymerizable polymer precursor and a polymerization initiator.

The heat-diffusible coloring matter contained in the image forming medium used in the present invention includes, for example, monoazo dyes, thiazoleazo dyes, anthraquinone dyes, triallylmethane dyes, rhodemine dyes, naphthol dyes, triallylmethane coloring matters, fluorane coloring matters, and phthalide coloring matters.

The heat-diffusible coloring matter, in general, has a larger heat-diffusibility as the molecular weight becomes smaller, and also has a smaller heat-diffusibility as the coloring matter has more polar groups as exemplified by a carboxyl group, an amino group, a hydroxyl group, a nitro group and a sulfone group. Accordingly, coloring matters having the desired heat-diffusibility may be appropriately selected on the basis of the molecular weight and polar groups, depending on the degree of polymerization or crosslink density and heating conditions in the image forming medium of the present invention. The heat-diffusible coloring matter contained in a large amount may be desirable in that the image on the image receiving medium can be made to have a high density. An excessively large amount, however, is not desirable because the coloring matter may inhibit the action of the polymerization initiator to sometimes lower the rate of polymerization reaction when the latent image is formed. From these view points, the heat-diffusible coloring matter may be contained in an amount of from 2.5 to 50% by weight, and preferably from 5 to 20% by weight, in the recording layer 1.

A heat-diffusible color former, capable of forming a color as a result of reaction with the developer in the image receiving medium after the heat-diffusion, can also be used as the heat-diffusible coloring matter. Preferably used as such a heat-diffusible coupler are couplers that can be diffused by heat, such as pressure-sensitive dyes or heat-sensitive dyes hitherto used in pressure-sensitive papers or heat-sensitive papers.

The heat-diffusible color formers usable in the present invention include, for example, color formers of;
(1) a triphenylmethane-phthalide type;
(2) a fluorane type;
(3) a phenothiazine type;
(4) an indolylphthalide type;
(5) a Leucoauramine type;
(6) a spiropyran type;
(7) a Rhodamine lactam type;
(8) a triphenylmethane type;
(9) an azaphthalide type;
(10) a chromenoindol type; and
(11) a triazene type.

In particular, preferably used are;

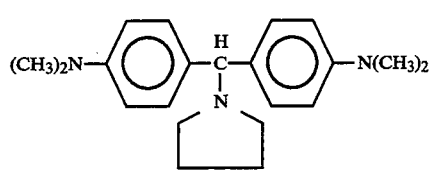
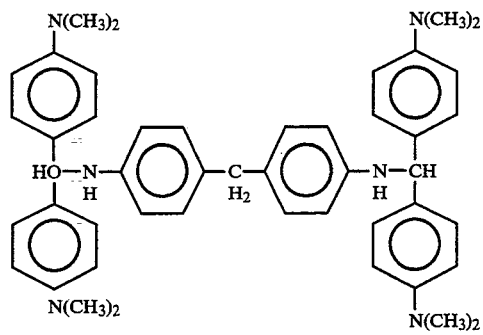
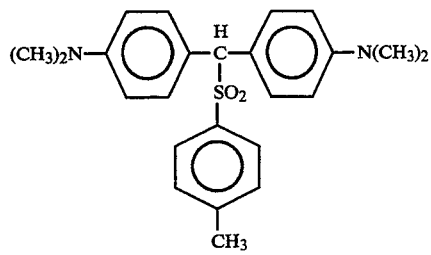
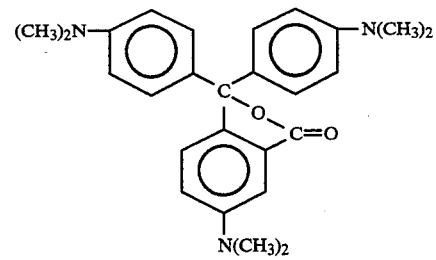
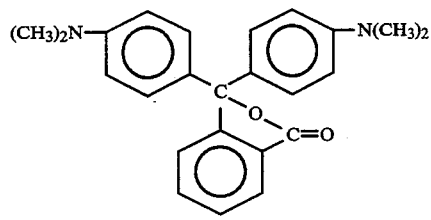
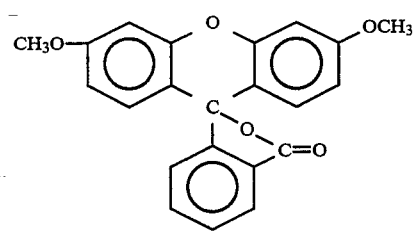
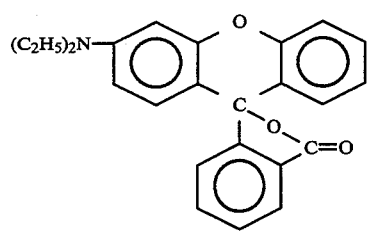
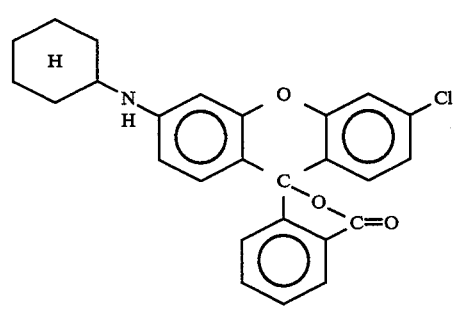
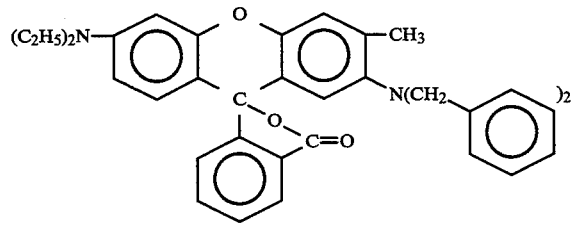
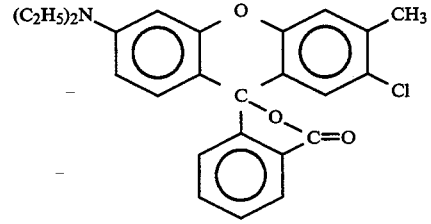
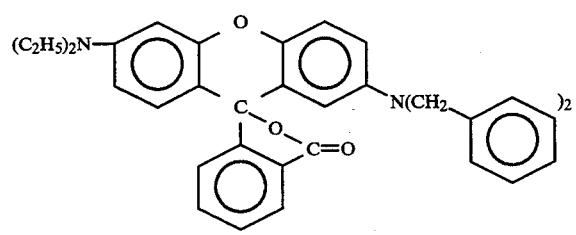
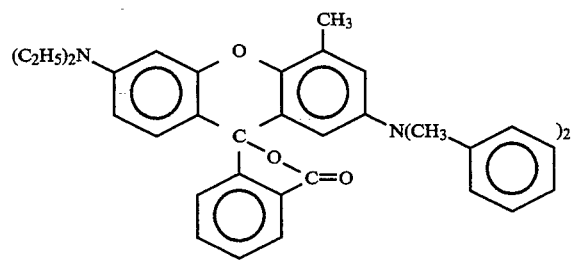

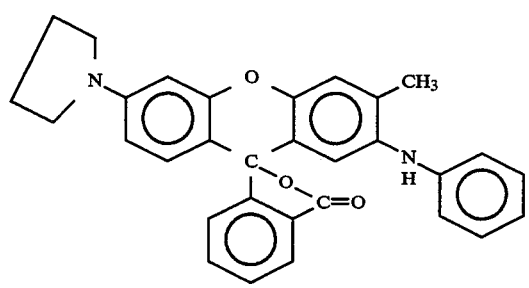
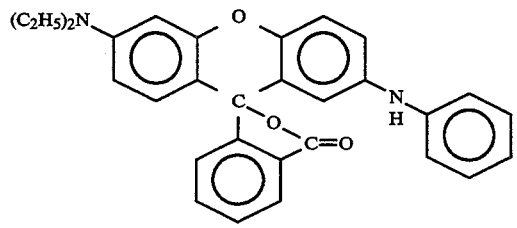
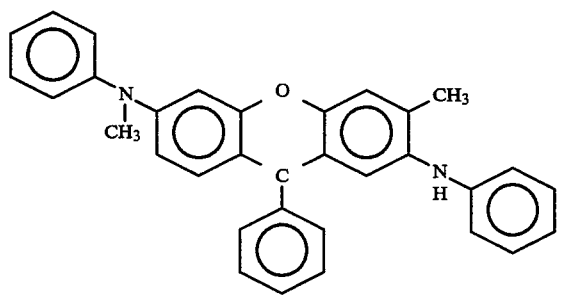
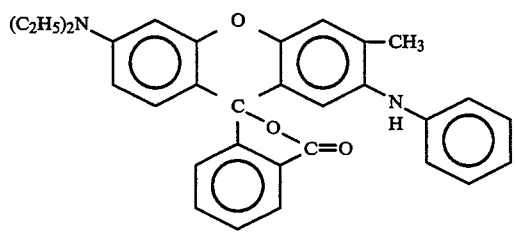
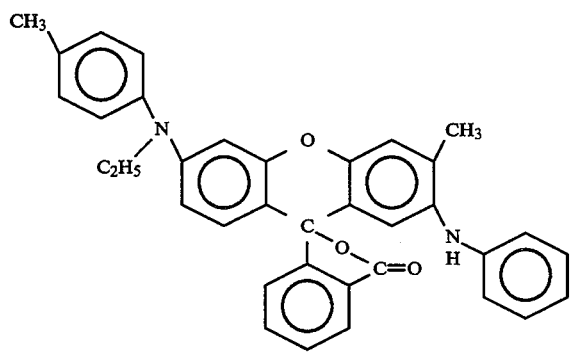
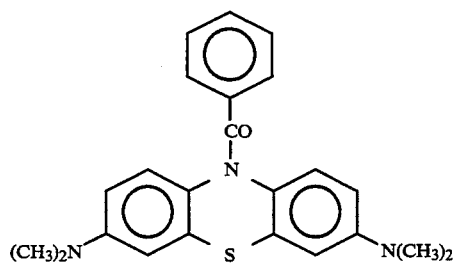
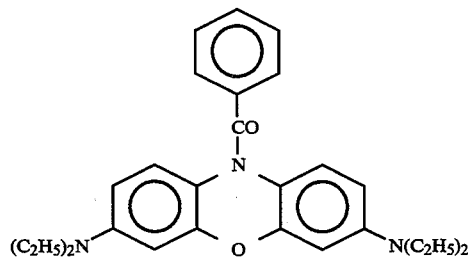
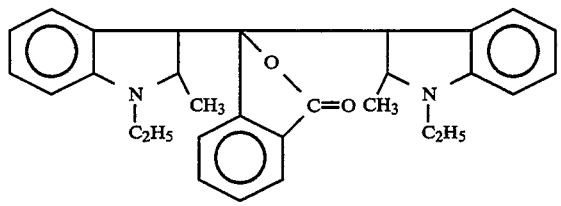
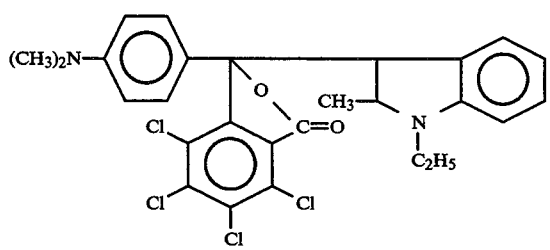
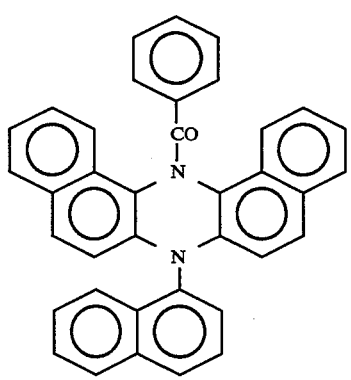

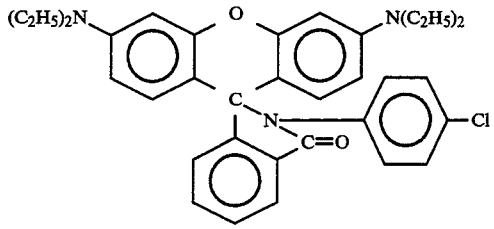

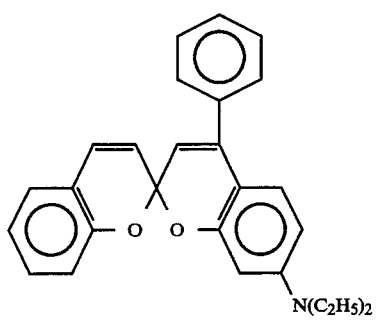

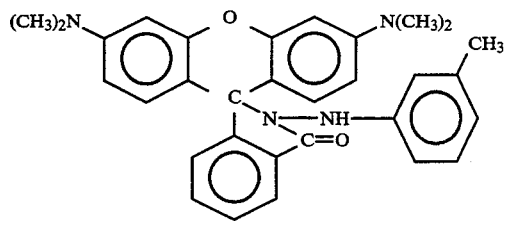

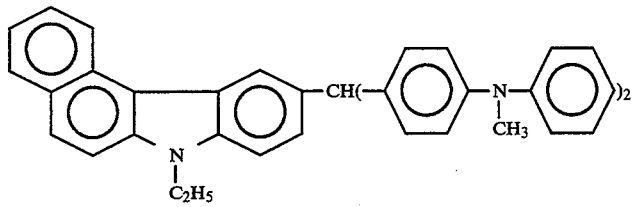

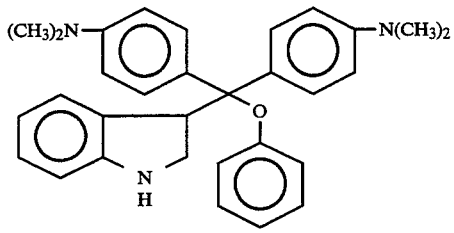

As the developer that reacts with the heat-diffusible color former, zinc oxide, calcium sulfate, novolac type phenol resins, zinc 3,5-dimethyl-tertbutyl salicylate, etc. can be used.

As the polymerizable polymer precursor contained in the image forming medium used in the method of the present invention, a compound having at least one reactive vinyl group in its molecule can be utilized, and there can be used, for example, at least one selected from the group consisting of reactive vinyl group-containing monomers, reactive vinyl group-containing oligomers and reactive vinyl group-containing polymers.

The reactive vinyl group in these compounds includes substituted or unsubstituted vinyl groups having polymerization reactivity, as exemplified by styrene type vinyl groups, acrylic acid type vinyl groups, mathacrylic acid vinyl groups, allyl type vinyl groups, and vinyl ethers, as well as ester type vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether; divalent monomers as exemplified by divinylbenzene, distyryl oxalate, distyryl melonate, distyryl succinate, distyryl glutarete, distyryl adipate, distyryl maleate, distyryl fumerate, distyryl β,β'-dimethylglutarate, distyryl 2-bromoglutarate, distyryl α,α'-dichloroglutarate, distyryl terephthalate, oxalic acid di(ethyl acrylete), oxalic acid di(methyl ethyl acrylate), malonic acid di(ethyl acrylate), malonic acid di(methyl ethyl acrylate), succinic acid di(ethyl acrylate), gluteric acid di(ethyl acrylate), adipic acid di(ethyl acrylate), maleic acid di(diethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), $\beta,\beta'$-dimethylglutaric acid di(ethyl methacrylate), 1,4-phenylenebis(oxyethyl methacrylate), and 1.4-bis(methacryloyloxyethoxy)cyclohexane acryloyloxyethoxyethyl vinyl ether; trivalent monomers as exemplified by pentaerythritol triacrylate, pentaerythritol trimethacrylate, pentaerythritol tri(hydroxystyrene), cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropene tri(ethyl acrylete), cyanuric acid tri(ethyl vinyl ether), a condensate of a reaction product between 1,1,1-trimethylolpropene and three-fold moles of toluenediisocyanate, with hydroxyethyl acrylate, and a condensate of a reaction product between 1,1,1-trimethylolpropene and three-fold moles of hexenediisocyanate, with p-hydroxystyrene; and tetravalent monomers as exemplified by ethylenetetraacrylamide, and propylenetetraacrylamide.

These polymerizable polymer precursors may be used in combination of two or more kinds.

The polymerization initiator contained in the image forming medium used in the method of the present invention includes a photopolymerization initiator and/or a thermopolymerization initiator.

Known initiators can be used as the thermopolymerization initiator, which may include, for example, azo initiators and peroxide initiators. The azo initiator refers to an organic compound having at least one nitrogen-nitrogen double bond in its molecule, and may include, for example, azobisisobutyronitrile, azobiscyclohexanecarbonitrile, azobismethylphenethylcarbonitrile, azobis-secamylonitrile, azobisphenylethane, azobiscyclohexylpropylonitrile, azobismethylchloroethane, triethylazobenzene, phenylazoisobutyronitrile, and 9-(p-nitrophenylazo)-9-phenylfluorenone. The peroxide initiator includes almost all the compounds so long as they are organic compounds having at least one oxygen-oxygen bond in the molecule. For example, it may include methyl ethyl ketone peroxide, cyclohexanone peroxide, 3,3,5-trimethylcyclohexanone peroxide, methylcyclohexanone peroxide, acetylacetone peroxide, 1,1'-bis(tertiary-butylperoxy)-3,3,5-trimethylcyclohexane, 1,1'-bis(tertiary-butylperoxy) cyclohexane, n-butyl-4,4-bis(tertiarybutylperoxy)valerate, 2,2'-bis(tertiarybutylperoxy)butane, tertiary-butyl hydroperoxide cumene hydroperoxide, para-menthane hydroperoxide, 1,1,3,3-tetramethylbutyl hydroperoxide, ditertiarybutyl peroxide, tertiary-butylamyl peroxide, dicumyl peroxide, $\alpha,\alpha'$-bis(tertiary-butylperoxyisopropyl) benzene, 2,5-dimethyl-2,5-di(tertiary-butylperoxy) hexane, 2,5-dimethyl-2,5-di(tertiary-butylperoxy) hexyne-3-acetyl peroxide, isobutyl peroxide, octanoyl peroxide; decanoyl peroxide, lauroyl peroxide, 3,5,5-trimethylhexanoyl peroxide, succinic acid peroxide, benzoyl peroxide, 2,4-dichlorobenzoyl peroxide, m-toluoyl peroxide, diisopropyl peroxydicarbonate, di-2-ethylhexyl peroxydicarbonate, dinormalpropyl peroxydicarbonate, di-2-ethoxyethyl peroxydicarbonate, dimethoxyisopropyl peroxydicarbonate, di(3-methyl-3-methoxybutyl)peroxydicarbonate, tertiary-butyl peroxyacetate, tertiary-butyl peroxyisobutyrate, tertiary-butyl peroxypivarate, tertiary-butyl peroxyneodecanoate, tertiary-butyl peroxyoctanoate, tertiary-butyl peroxy-3,5,5-trimethylhexanoate, tertiary-butyl peroxylaurate, tertiary-butyl peroxybenzoate, ditertiary-diperoxyisophthalate, 2,5-dimethyl-2,5-di(benzoylperoxy)hexane, tertiary-butyl maleic acid peroxide, and tertiary-peroxyisopropyl carbonate, by which, however, the present invention is by no means limited and other known thermopolymerization initiators can also be used.

The photopolymerization initiator includes, for example, carbonyl compounds, sulfur compounds, halogen compounds, and photopolymerization initiators of redox type.

Specifically, the carbonyl compounds include diketones as exemplified by benzyl, 4,4'-dimethoxybenzyl, diacetyl, and camphorquinone; benzophenones as exemplified by 4,4'-diethylaminobenzophenone, and 4,4'-dimethylbenzophenone; acetophenones as exemplified by acetophenone, 4-methoxyscetophenone; benzoin alkyl ethers; thioxanthones as exemplified by 2-chlorothioxanthone, 2,4-diethylthioxanthone, and thioxanthone-3-carboxylic acid-$\beta$-methoxy ethyl ester; chalcones and styrylketones having a dialkylamino group; and cumarines as exemplified by 3,3'-carbonylbis(7-methoxycumarine), and 3,3'-carbonylbis(7-diethylaminocumarine).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above, two or more compounds can also be used in combination to obtain a more efficient photopolymerization reaction.

Such combination of the photopolymerization initiators includes a combination of chalcones having a dialkylamino group and styrylketones or cumarins, with S-triazines having a trihalomethyl group or camphorquinone. Other polymerization initiators may also be further used in combination with the combination of these polymerization initiators.

The image forming medium used in the present invention contains as essential components the heat-diffusible coloring matter, polymerizable polymer precursor and polymerization initiator as described above.

The image forming medium used in the present invention can be formed in the form of desired layers by dissolving the above essential components in a solvent together with a binder appropriately used, and coating the resulting solution on the support made of metal, plastic, paper, etc., or, when the strength is kept by the binder itself, by incorporating the above essential components into a film- or sheet-like material formed by the binder, without use of the support. When the binder is incorporated into the image forming medium, the glass transition point of the binder may sometimes affect the glass transition point of the latent image (particularly when the binder has a low glass transition point). Hence, the binder must be appropriately selected taking this into consideration.

When the image forming medium is made in the desired form, the form may be any of a flat sheet, a cylinder, a roll, etc., without any particular limitations. The recording layer may preferably have a thickness of from 0.1 μm to 2 mm, and more preferably from 1 μm to 0.1 mm, in approximation. The recording layer may not be limited to a single layer, and may be of multi-layer structure comprising a layer containing the polymerizable polymer precursor and polymerization initiator and a layer containing the heat-diffusible coloring matter.

Suitable binders used in the present invention can be selected from a wide range of resins.

They specifically include cellulose esters as exemplified by nitrocellulose, cellulose phosphate, cellulose sulfate, cellulose acetate, cellulose propionate, cellulose butyrate, cellulose myrystate, cellulose palmirate, cellulose acetate-propionate, and cellulose acetate-butyrate; cellulose ethers as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetel, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyacrylate resins as exemplified by poly(4,4'-isopropylidene,diphenylene-co-1,4-cyclohexylenedimethylene carbonate), poly(ethylenedioxy-3,3'-phenylene thiocarbonate), poly(4,4'-isopropylidene,-diphenylene carbonate-coterephthalate), poly(4,4'-isopropylidene,diphenylene carbonate), poly(4,4'-sec-butylidene,diphenylene carbonate), and poly(4,4'-isopropylidene,diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

In the image forming medium of the present invention, the binder is not an essential component. It may not particularly be contained when the film formation properties, dispersion and sensitivity can be assured.

In addition, anti-fading agents, solid solvents, surface active agents, antistatic agents, and so forth can also be optionally added in the image forming medium of the present invention.

The above components in the image forming medium used in the present invention may preferably be mixed in the following proportion.

The polymerizable polymer precursor may preferably be contained in a proportion of from 10 to 90% by weight, and more preferably from 20 to 80% by weight, in the recording layer. The polymerization initiator may preferably be contained in a proportion of from 0.1 part by weight to 30 parts by weight, and more preferably from 0.5 to 20 parts by weight, based on 100 parts by weight of the polymerizable polymer precursor.

The recording layer 1 of the image forming medium used in the present invention may preferably be provided with a protective layer comprising polyvinyl alcohol, polyethylene terephthalate or the like. In the instance where the recording layer is provided with the protective layer, the protective layer is removed before the heat-diffusible coloring matter is transferred. If, however, the protective layer is capable of transmitting the heat-diffusible coloring matter, it is not necessary to remove the protective layer.

To form a color image according to the method of the present invention, image forming mediums using heat-diffusible coloring matters of yellow, magenta, cyan, black, etc. may be formed, where images may be successively formed using these image forming mediums having different colors, and then the images with different colors may be overlapped.

EXAMPLES

The present invention will be described below in greater detail by giving Examples. In the following description, the "part(s)" that represents the amount proportion is by weight unless particularly mentioned.

Example 1

| | |
|---|---|
| 3,3-Carbonylbis(7-methoxycumarine) | 0.16 part |
| Ethyl p-dimethylaminobenzoate | 0.04 part |
| Pentaerythritol tetraacrylate | 1.0 part |
| Acrylate-styrene copolymer | 1.0 part |
| Diffusible dye: MS Magenta VP (available from Mitsui Toatsu Chemicals, Inc.) | 0.3 part |
| Methyl ethyl ketone | 10 parts |

A solution having the above composition was prepared: The solution was applied on a heat resisting treated polyethylene terephthalate (PET) film of 6 μm thick using an applicator so as to give a dried film thickness of 3 μm, to form a recording layer. Subsequently, a polyvinyl alcohol (PVA) film of 3 μm thick was further provided on the recording layer to obtain an image forming medium.

On the PVA film of the image forming medium thus obtained, a negative image was fitted, followed by exposure to light to carry out formation of a latent image. Here, the exposure was carried out for 20 seconds using as a light source a fluorescent lamp having a fluorescent peak at 350 nm, setting the light source with a distance of 3 cm from the recording layer.

Here, the completely polymerized area and completely unpolymerized area of the latent image were taken out and measurement of Tg at the respective areas was made. As a result, $Tg_2$ at the polymerized area was found to be 120° C.; and $Tg_1$ at the unpolymerized area, 50° C. Namely, $Tg_2-Tg_1=70°$ C. The image forming medium in which this latent image has been formed is the image forming medium of the present invention.

Subsequently, the PVA film was removed by washing the image forming medium with water. Next, water was well removed. Thereafter, using as an image-receiving medium a synthetic paper provided thereon with an image-receiving layer formed with polyester resin, the recording layer and the image-receiving layer were laid overlapping face-to-face, followed by heating from the PET film side under conditions of 100° C. and 10 seconds, thereby diffusion-transferring the dye in the recording layer to the image-receiving layer. Thus, a sharp red dye image was obtained on the image-receiving paper.

In the above transfer process, the dye in the unpolymerized area was transferred to the image-receiving layer in a good state, and the resulting transferred image area had an optical density of not less than 2.0. On the other hand, the dye in the polymerized area was little transferred, and the optical density on the image-receiving layer at the area corresponding to the polymerized area, i.e., "fog density", was about 0.03.

Images were also formed using various temperatures within the temperature range of not less than 50° C. ($Tg_1$) and less than 120° C. ($Tg_2$). As a result, in all the cases the fog density was not more than 0.10, and the transferred image area showed an optical density of not less than 2.0 at the temperature at which the dye is sufficiently sublimated (i.e., not less than 90° C.).

Comparative Example 1

Example 1 was repeated to form images, except that the transfer was carried out at temperatures of not less than 130° C. ($Tg_2$). As a result, the fog density became as high as about 0.3.

Comparative Example 2

Example 1 was repeated to form images, except that the transfer was carried out at temperatures of less than 50° C. ($Tg_1$), As a result, nothing was transferred at all.

Example 2

| | |
|---|---|
| Acrylate-styrene copolymer | 10 parts |
| Kayarad DPHA | 10 parts |
| (available from Nippon Kayaku Co., Ltd.) | |
| Benzoyl peroxide | 0.1 part |
| Diffusible dye: MS Cyan VP | 2 parts |
| (available from Mitsui Toatsu Chemicals, Inc.) | |

A solution having the above composition was prepared. The solution was applied on a heat resisting treated PET film (x) of 6 μm thickness using a wire bar so as to give a dried film thickness of 3 μm, to form a recording layer. Subsequently, a PET film (y) of 4.5 μm thick was laminated on the recording layer to obtain an image forming medium.

On the PVA film (x) on the image forming medium, a thermal head was put, and a heating element was actuated to generate heat after image signals, to carry out formation of a latent image.

Here, the polymerized area and unpolymerized area of this latent image were taken out and measurement of Tg at the respective areas was made. As a result, $Tg_2$ at the polymerized area was found to be 150° C.; and $Tg_1$ at the unpolymerized area, 60° C. Namely, $Tg_2 - Tg_1 = 90°$ C. The image forming medium in which this latent image has been formed is the image forming medium of the present invention.

Subsequently, the laminate layer of the image forming medium was peeled. Thereafter, using as an image-receiving medium a synthetic paper provided thereon with an image-receiving layer formed with polyester resin, the recording layer and the image-receiving layer were laid overlapping face-to-face, followed by heating from the PET film (x) side under conditions of 100° C. and 10 seconds, thereby diffusion-transferring the dye in the recording layer to the image-receiving layer. Thus, a sharp blue dye image was obtained on the image-receiving paper.

In the above transfer process, the dye in the unpolymerized area was transferred to the image-receiving layer in a good state, and the resulting transferred image area had an optical density of not less than 1.7. On the other hand, the dye in the polymerized area was little transferred, and the fog density was about 0.04.

Images were also formed using various temperatures within the temperature range of not less than 60° C. ($Tg_1$) and less than 150° C. ($Tg_2$). As a result, in all the cases the fog density was not more than 0.10, and the transferred image area showed an optical density of not less than 1.5 at the temperature at which the dye is sufficiently sublimated (i.e., not less than 100° C.).

Comparative Example 3

Example 2 was repeated to form images, except that the transfer was carried out at a temperature of 160° C. As a result, the fog density turned to about 0.5.

Comparative Example 4

Example 2 was repeated to form images, except that the transfer was carried out at a temperature of 40° C. As a result, the optical density at the transferred area was 0.

Example 3

| | |
|---|---|
| Methyl methacrylate | 10 parts |
| (Dianal BR-88; available from Mitsubishi Rayon Co., Ltd.) | |
| Kayarad DPHA | 4 parts |
| (available from Nippon Kayaku Co., Ltd.) | |
| 2,4-Diethylthioxanthone | 0.5 part |
| Ethyl dimethylaminobenzoate | 0.5 part |
| MS Magenta VP | 3 parts |
| (available from Mitsui Toatsu Chemicals, Inc.) | |
| Methyl ethyl ketone | 92 parts |

A coating solution having the above composition was prepared. The coating solution was applied on a 25 μm thick polyester film so as to give a dried film thickness of 3 to 4 μm, to form a recording layer.

Next, on the recording layer, a 6 μm thick polyester film as an oxygen-barrier layer was laminated to obtain an image forming medium of the present invention.

Using a fluorescent lamp having a fluorescent peak at 380 nm, this image forming medium was irradiated with light for 60 seconds from the 6 μm thick polyester film side through a mask of a lith film, to form a polymer image. Here, Tg of the polymerized area and unpolymerized area of this latent image was measured according to the same method as previously described. As a result, $Tg_2$ at the polymerized area was found to be 90° C.; and $Tg_1$ at the unpolymerized area, 60° C.

Subsequently, the 6 μm thick polyester film was peeled. An image-receiving medium provided thereon with an image-receiving layer comprising a saturated polyester resin, and the recording layer were brought into face-to-face contact, which were then passed through heat rollers heated to 85° C., at a speed of 0.2 mm/sec., and thereafter the recording layer was peeled from the image receiving medium. As a result, a sharp red image was obtained on the image-receiving medium.

Example 4

| | |
|---|---|
| Methyl methacrylate/ethyl methacrylate copolymer (methyl methacrylate:ethyl methacrylate = 9:1 in molar ratio) | 10 parts |
| Trimethylolpropane triacrylate | 3.5 parts |
| Benzyl dimethyl ketal | 0.5 part |
| MS Cyan VP (available from Mitsui Toatsu Chemicals, Inc.) | 2.5 parts |
| Methyl ethyl ketone | 83.5 parts |

A coating solution having the above composition was prepared. The coating solution was applied on a 25 μm thick polyester film so as to give a dried film thickness of 3 to 4 μm, to form a recording layer.

Next, on the recording layer, a 6 μm thick polyester film as an oxygen-barrier layer was laminated to obtain an image forming medium of the present invention.

Using a fluorescent lamp having a fluorescent peak at 340 nm, this image forming medium was irradiated with light for 90 seconds from the 6 μm thick polyester film side through a mask of a lith film, to form a polymer image. Here, Tg of the polymerized area and unpolymerized area of this latent image was measured according to the same method as previously described. As a result, $Tg_2$ at the polymerized area was found to be 85° C.; and $Tg_1$ at the unpolymerized area, 60° C.

Subsequently, the 6 μm thick polyester film was peeled. An image-receiving medium provided thereon with an image-receiving layer comprising a saturated polyester resin, and the recording layer were brought into face-to-face contact, which were then passed through heat rollers heated to 80° C., at a speed of 0.1 mm/sec., and thereafter the recording layer was peeled from the image receiving medium. As a result, a sharp blue image with somewhat low maximum density was obtained on the image-receiving medium.

Example 5

| | |
|---|---|
| Polyvinyl butyral | 10 parts |
| Kayarad DPHA (available from Nippon Kayaku Co., Ltd.) | 10 parts |
| 2,4-Diethylthioxanthone | 1.0 part |
| Ethyl dimethylaminobenzoate | 1.0 part |
| MS Magenta VP (available from Mitsui Toatsu Chemicals, Inc.) | 1.5 parts |
| Methyl ethyl ketone | 176.5 parts |

A coating solution having the above composition was prepared. The coating solution was applied on a 25 μm thick polyester film so as to give a dried film thickness of 4 to 5 μm, to form a recording layer. Next, on the recording layer, a 6 μm thick polyester film as an oxygen-barrier layer was laminated to obtain an image forming medium of the present invention.

Using a fluorescent lamp having a fluorescent peak at 380 nm, this image forming medium, while being heated at 60° C., was irradiated with light from the 6 μm thick polyester film side to form a polymer image. The irradiation time was varied to be 1 second, 10 seconds, 30 seconds or 60 seconds. Tg of each case was measured according to the same method as previously described. Results of the measurement are shown in Table 1.

Subsequently, the 6 μm thick polyester film was peeled for each recording layer. An image-receiving medium provided thereon with an image-receiving layer comprising a saturated polyester resin, and each recording layer were brought into face-to-face contact, which were then passed through heat rollers heated to 90° C., at a speed of 0.2 mm/sec., and thereafter the recording layer was peeled from the image receiving medium. As a result, a red image with gradation was obtained on each image-receiving medium.

TABLE 1

| Exposure time | Glass transition point | Optical density |
|---|---|---|
| 0 second | 25° C. ($Tg_1$) | 1.40 |
| 1 second | 60° C. | 0.45 |
| 10 seconds | 85° C. | 0.24 |
| 30 seconds | 92.5° C. | 0.13 |
| 60 seconds | 115° C. ($Tg_2$) | 0.06 |

As described above, the present invention can obtain a good image with a high contrast and free of fog. It also enables formation of a highly gradational image according to an easy control and easy operation.

We claim:

1. An image forming method comprising the steps of:
   (a) using an image forming medium having a recording layer coated on a support, said recording layer containing a heat-diffusible coloring matter, a polymerizable polymer precursor and a polymerization initiator, wherein said heat-diffusible coloring matter is present in an amount from about 5.0 to about 20 percent by weight of the recording layer and said polymerization initiator is present in an amount of from about 0.5 to about 20 parts by weight based on 100 parts by weight of said polymerizable polymer precursor;
   (b) causing said polymerizable polymer precursor of said image forming medium to selectively polymerize to form a latent image comprised of a polymerized area and an unpolymerized area; and
   (c) heating said image forming medium on which said latent image has been formed and which is laid overlapping on an image receiving medium to diffusion-transfer said heat-diffusible coloring matter contained in said image forming medium to said image receiving medium, so as to satisfy the following formula (A):

$Tg_1 \leq Ttrans \leq Tg_2$ wherein Ttrans represents a temperature of said image forming medium during said diffusion-transfer of said heat-diffusible coloring matter, $Tg_1$ represents a glass transition point of said unpolymerized area, and $Tg_2$ represents a glass transition point of said polymerized area,
   wherein the glass transition point Tga of said unpolymerized area and the glass transition point $Tg_2$ of said polymerized area is in the relationship of $Tg_2 - Tg_1 \geq 30°$ C., thereby forming an image comprised of said heat-diffusible coloring matter on said image receiving medium.

2. An image forming method according to claim 1, wherein said heat-diffusible coloring matter react with a developer to form a color.

3. An image forming method according to claim 1, wherein said latent image has three or more glass transition points.

4. An image forming method according to claim 1, wherein said $Tg_1$ is within the range of from about 50° to 80° C.

5. An image forming method according to claim 1, wherein said $Tg_2$ is within the range of from about 120° to 220° C.

6. An image forming method comprising the steps of:
(a) using an image forming medium having a recording layer coated on a support, said recording layer containing a heat-diffusible coloring matter, a polymerizable polymer precursor and a polymerization initiator, wherein said heat-diffusible coloring matter is present in an amount from about 5.0 to about 20 percent by weight of the recording layer and said polymerization initiator is present in an amount of from about 0.5 to about 20 parts by weight based on 100 parts by weight of said polymerizable polymer precursor;
(b) causing said polymerizable polymer precursor of said image forming medium to selectively polymerize to form a latent image comprised of a polymerized area and an unpolymerized area; and
(c) heating said image forming medium on which said latent image has been formed and which is laid overlapping on an image receiving medium to diffusion-remove said heat-diffusible coloring matter contained in said image forming medium, so as to satisfy the following formula (A):

$$Tg_1 \leq T_{trans} \leq Tg_2$$

wherein $T_{trans}$ represents a temperature of said image forming medium during said diffusion-removal of said heat-diffusible coloring matter, $Tg_1$ represents a glass transition point of said unpolymerized area, and $Tg_2$ represents a glass transition point of said polymerized area, wherein the glass transition point $Tg_1$ of said unpolymerized area and the glass transition point $Tg_2$ of said polymerized area is in the relationship of $Tg_2 - Tg_1 \geq 30°$ C., thereby forming an image comprised of said heat-diffusible coloring matter having remained on said image forming medium.

* * * * *

UNITED STATES PATENT AND TRADEMARK OFFICE
CERTIFICATE OF CORRECTION

PATENT NO. : 5,364,732  Page 1 of 2
DATED : November 15, 1994
INVENTOR(S) : AKIHIRO MOURI, ET AL.

It is certified that error appears in the above-indentified patent and that said Letters Patent is hereby corrected as shown below:

ON TITLE PAGE ITEM [57],

ABSTRACT, Line 1:
"method," should read --method-- and
"of," should read --of--.

COLUMN 1

Line 30, "doner" should read --donor--.
Line 33, "doner" should read --donor--.
Line 35, "doner" should read --donor--.
Line 39, "doner" should read --donor--.
Line 42, "doner" should read --donor--.
Line 44, "doner" should read --donor--.
Line 55, "doner" should read --donor--.
Line 58, "doner" should read --donor--.

COLUMN 2

Line 4, "doner" should read --donor--.

COLUMN 3

Line 15, "(B)." should read --(B):--.

COLUMN 4

Line 24, "method (In" should read --method. In--.

COLUMN 15

Line 15, "1.4-bis" should read --1,4-bis--.

UNITED STATES PATENT AND TRADEMARK OFFICE
CERTIFICATE OF CORRECTION

PATENT NO. : 5,364,732
DATED : November 15, 1994
INVENTOR(S) : AKIHIRO MOURI, ET AL.

It is certified that error appears in the above-indentified patent and that said Letters Patent is hereby corrected as shown below:

COLUMN 16

Line 25, "4-methoxyscetophenone;" should read --4-methoxyacetophenone;--.

COLUMN 17

Line 30, "acetel," should read --acetal,--.

COLUMN 18

Line 37, "pared:" should read --pared.--.

COLUMN 22

Line 53, "Tga" should read --$Tg_1$--.
    Line 60, "react" should read --reacts--.

Signed and Sealed this

Fourth Day of April, 1995

*Attest:*

BRUCE LEHMAN

*Attesting Officer*     *Commissioner of Patents and Trademarks*